(12) United States Patent
Ryu et al.

(10) Patent No.: US 11,772,364 B2
(45) Date of Patent: Oct. 3, 2023

(54) ADHESIVE MEMBER AND DISPLAY DEVICE INCLUDING THE SAME

(71) Applicant: SAMSUNG DISPLAY CO., LTD., Yongin-si (KR)

(72) Inventors: Jonggil Ryu, Gwangmyeong-si (KR); Seungmin Lee, Hwaseong-si (KR); Jonghak Hwang, Yongin-si (KR); Kwangnyun Kim, Cheonan-si (KR); Chulkyu Choi, Asan-si (KR); Namjin Kim, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/819,298

(22) Filed: Aug. 11, 2022

(65) Prior Publication Data
US 2022/0410536 A1 Dec. 29, 2022

Related U.S. Application Data

(62) Division of application No. 16/529,661, filed on Aug. 1, 2019, now Pat. No. 11,426,978.

(30) Foreign Application Priority Data

Oct. 5, 2018 (KR) .......................... 10-2018-0118732

(51) Int. Cl.
*B32B 17/06* (2006.01)
*C09J 7/20* (2018.01)
(Continued)

(52) U.S. Cl.
CPC ................ *B32B 17/06* (2013.01); *B32B 7/12* (2013.01); *B32B 37/18* (2013.01); *C09J 7/20* (2018.01);
(Continued)

(58) Field of Classification Search
None
See application file for complete search history.

(56) References Cited

U.S. PATENT DOCUMENTS 8,269,906 B2   9/2012  Nomura
9,674,961 B2   6/2017  Ahn
(Continued)

FOREIGN PATENT DOCUMENTS

CN    101345015 A    1/2009
CN    101825784 A    9/2010
(Continued)

*Primary Examiner* — Erik Kielin
(74) *Attorney, Agent, or Firm* — Lewis Roca Rothgerber Christie LLP

(57) ABSTRACT

A display device according to embodiments of the present disclosure includes a display panel, a protection member to protect the display panel, and an adhesive member between the display panel and the protection member to couple the display panel to the protection member. The display panel may include a plurality of pixels to display an image, and the adhesive member may include an adhesive agent and an anti-static agent dispersed in the adhesive agent. The anti-static agent may include halogen ions, and a content of halogen ions with respect to a total weight of the adhesive agent may be within a range (e.g., from about 1 ppm to about 1000 ppm) capable of reducing stain failures caused by static electricity, without causing corrosion of driving lines in the display.

3 Claims, 12 Drawing Sheets

(51) Int. Cl.
   *B32B 37/18* (2006.01)
   *B32B 7/12* (2006.01)
   *F16B 11/00* (2006.01)
   *H10K 50/844* (2023.01)
   *H10K 59/88* (2023.01)
   *H10K 59/126* (2023.01)
   *H10K 50/80* (2023.01)

(52) U.S. Cl.
   CPC .......... *F16B 11/006* (2013.01); *H10K 50/844* (2023.02); *H10K 59/126* (2023.02); *H10K 59/88* (2023.02); *H10K 50/80* (2023.02)

(56) References Cited

U.S. PATENT DOCUMENTS

| | | | |
|---|---|---|---|
| 10,347,700 | B2 | 7/2019 | Yang et al. |
| 10,459,554 | B2 | 10/2019 | Funayama et al. |
| 10,705,261 | B2 | 7/2020 | Hwang et al. |
| 2009/0015577 | A1 | 1/2009 | Nishimoto et al. |
| 2011/0068306 | A1 | 3/2011 | Liao et al. |
| 2011/0109849 | A1 | 5/2011 | Yoo et al. |
| 2014/0377550 | A1 | 12/2014 | Yasui et al. |
| 2017/0301299 | A1 | 10/2017 | Kubota et al. |
| 2018/0022973 | A1* | 1/2018 | Kim .......................... B32B 7/06 428/41.5 |
| 2020/0033673 | A1 | 1/2020 | Fujita et al. |

FOREIGN PATENT DOCUMENTS

| | | |
|---|---|---|
| CN | 104231950 A | 12/2014 |
| CN | 105150640 A | 12/2015 |
| CN | 106947306 A | 7/2017 |
| CN | 107230693 A | 10/2017 |
| CN | 107367853 A | 11/2017 |
| CN | 207409207 U | 5/2018 |
| JP | 2001-339131 A | 12/2001 |
| JP | 2015-185490 A | 10/2015 |
| KR | 10-2014-0012736 A | 2/2014 |
| KR | 10-2016-0036497 A | 4/2016 |
| KR | 10-2017-0045069 A | 4/2017 |
| KR | 10-2018-0011411 A | 2/2018 |
| KR | 10-1849339 B1 | 4/2018 |
| WO | WO 2012/129362 A2 | 9/2012 |

* cited by examiner

ADHESIVE MEMBER AND DISPLAY DEVICE INCLUDING THE SAME

CROSS-REFERENCE TO RELATED APPLICATIONS

This application is a divisional of U.S. patent application Ser. No. 16/529,661, filed Aug. 1, 2019, which claims priority to and the benefit of Korean Patent Application No. 10-2018-0118732, filed Oct. 5, 2018, the entire content of both of which is incorporated herein by reference.

BACKGROUND

One or more aspects of example embodiments of the present disclosure are related to an adhesive member and a display device including the same, and in particular, to an adhesive member having improved anti-corrosion properties, and a display device including the same.

Electronic devices, such as smart phones, tablets, notebook computers, and smart television sets, are being developed. Each of these example electronic devices includes a display device that is used to provide information to a user, and includes a display panel and a control unit connected to the display panel.

The display device may further include an adhesive agent, which is used to immobilize components constituting (forming) the display device. The adhesive agent may contain (include) an anti-static agent to prevent or reduce an electrostatic discharge from occurring between components.

SUMMARY

One or more aspects of example embodiments of the present disclosure are directed toward a display device, which includes an anti-static agent containing (including) a limited or selected number of ions, and thereby in which metal lines are prevented or reduced from being corroded.

One or more example embodiments of the present disclosure provide a display device including a display panel including a plurality of pixels to display an image, a protection member to protect the display panel, and an adhesive member between the display panel and the protection member to couple the display panel to the protection member. The adhesive member may include an adhesive agent and an anti-static agent dispersed in the adhesive agent, and the anti-static agent may include or contain at least one of halogen ions and sulfur ions. A content of the halogen ions with respect to a total weight of the adhesive agent may range from 1 ppm (mg/kg) to 1000 ppm, and a content of the sulfur ions with respect to the total weight of the adhesive agent may range from 100 ppm to 500 ppm.

In some embodiments, the anti-static agent may include a conductive polymer and a surfactant, and the halogen ions may be contained (included) in the surfactant.

In some embodiments, the sulfur ions are contained in at least one selected from the conductive polymer and the surfactant.

In some embodiments, the halogen ions may include fluorine ions, and a content of the fluorine ions with respect to the total weight of the adhesive agent may range from 100 ppm to 1000 ppm.

In some embodiments, the halogen ions may include chlorine ions, and a content of the chlorine ions with respect to the total weight of the adhesive agent may range from 1 ppm to 100 ppm.

In some embodiments, the adhesive agent may include at least one selected from an optical clear adhesive (OCA), a pressure sensitive adhesive (PSA), and an optical clear resin (OCR).

In some embodiments, the protection member may include at least one selected from a supporting layer, an impact absorption layer, and a light blocking layer.

One or more example embodiments of the present disclosure provide a display device including a display panel including a display region including a plurality of pixels to display an image, and a non-display region adjacent to the display region and including a plurality of pads, a driving circuit including driving pads coupled to the pads and driving lines connected to the driving pads, a protection member to protect the display panel (e.g., positioned below the display panel), an adhesive member between the display panel and the protection member, and a resin member covering at least a portion of a bottom surface of the driving circuit. Each of the pads may be connected to a corresponding pixel of the plurality of pixels, and the adhesive member may include an adhesive agent to couple the display panel to the protection member and an anti-static agent containing (including) at least one selected from sulfur ions and halogen ions. A content of the halogen ions with respect to a total weight of the adhesive agent may range from 1 ppm (mg/kg) to 1000 ppm.

In some embodiments, the halogen ions may include fluorine ions, and a content of the fluorine ions with respect to the total weight of the adhesive agent may range from 100 ppm to 1000 ppm.

In some embodiments, the halogen ions may include chlorine ions, and a content of the chlorine ions with respect to the total weight of the adhesive agent may range from 1 ppm to 100 ppm.

In some embodiments, the anti-static agent may include a conductive polymer and a surfactant. The sulfur ions may be contained (included) in at least one selected from the conductive polymer and the surfactant, and the halogen ions may be contained (included) in the surfactant.

In some embodiments, a content of the sulfur ions with respect to the total weight of the adhesive agent may range from 100 ppm to 500 ppm.

In some embodiments, each of the driving lines may include at least a portion that protrudes from a side surface of the display panel and is exposed to an outside of the driving circuit. The resin member may cover the exposed portion of each of the driving lines.

In some embodiments, the resin member may be in contact with a side surface of the adhesive member adjacent to the bottom surface of the driving circuit.

In some embodiments, the pads and the driving pads may be coupled to each other by an anisotropic conductive film (ACF).

In some embodiments, the driving circuit may include a flexible circuit substrate, on which the driving pads and the driving lines are positioned, and a driving chip, which is mounted on the flexible circuit substrate. The driving lines may be connected to the driving chip.

In some embodiments, each pixel in the plurality of pixels may include a thin film transistor including a plurality of electrodes and an organic light emitting device connected to the thin film transistor, and the pads may be positioned (arranged or deposited) at a same level as at least one of the electrodes.

One or more example embodiments of the present disclosure provide an adhesive member for use in a display device, including an adhesive agent and an anti-static agent dispersed in the adhesive agent. The anti-static agent may include a conductive polymer containing (including) sulfur ions and a surfactant containing (including) sulfur ions and fluorine ions. A content of the fluorine ions with respect to a total weight of the adhesive agent may range from 100 ppm (mg/kg) to 1000 ppm, and a content of the sulfur ions with respect to the weight of the adhesive agent may range from 100 ppm to 500 ppm.

In some embodiments, the anti-static agent may further include chlorine ions. A content of the chlorine ions with respect to the total weight of the adhesive agent may range from al ppm to 100 ppm.

In some embodiments, the adhesive agent may include at least one selected from an optical clear adhesive (OCA), a pressure sensitive adhesive (PSA), and an optical clear resin (OCR).

BRIEF DESCRIPTION OF THE DRAWINGS

The following example embodiments will be more clearly understood from the following brief description taken in conjunction with the accompanying drawings. The accompanying drawings represent non-limiting, example embodiments as described herein.

Figure 1:
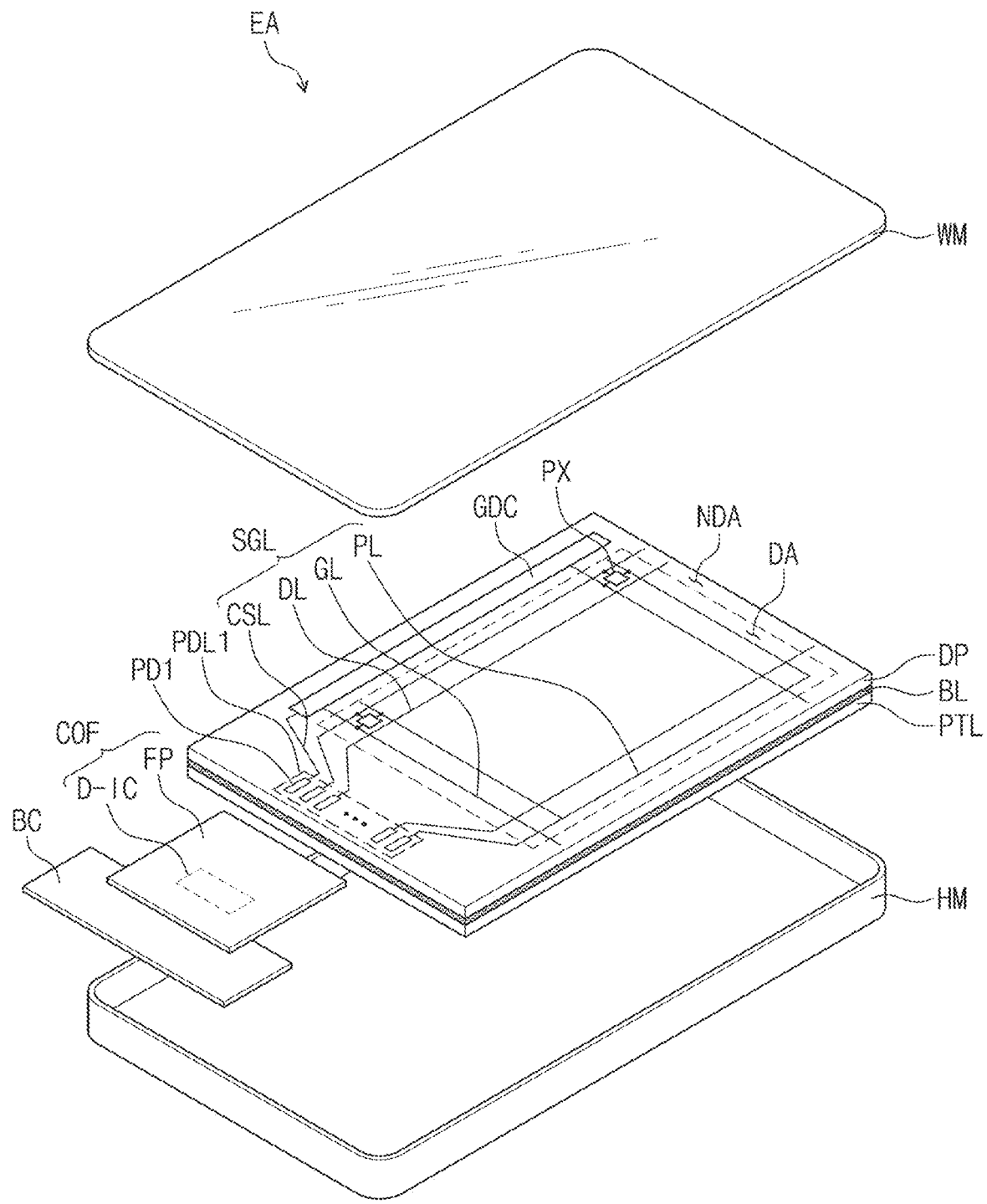
FIG. 1 is a perspective view illustrating a display device according to an embodiment of the present disclosure.

It should be noted that these figures are intended to illustrate general characteristics of methods, structure, and/or materials utilized in certain example embodiments, and to supplement the written description provided below. These drawings are not necessarily to scale, may not precisely reflect the precise structural or performance characteristics of any given embodiment, and should not be interpreted as defining or limiting the range of values or properties encompassed by example embodiments. For example, the relative thicknesses and positioning of molecules, layers, regions, and/or structural elements may be reduced or exaggerated in the drawings for clarity. The use of similar or identical reference numbers in various drawings is intended to indicate the presence of similar or identical elements and/or features.

DETAILED DESCRIPTION

Example embodiments of the present disclosures will now be described more fully with reference to the accompanying drawings, in which example embodiments are shown. The present disclosure may be embodied in many different forms, and should not be construed as being limited to the embodiments set forth herein. Rather, these embodiments are provided so that this disclosure will be thorough and complete, and will fully convey the concept of example embodiments to those of ordinary skill in the art. In the drawings, the thicknesses of layers and regions may be exaggerated for clarity. Like reference numerals in the drawings denote like elements, and duplicative descriptions thereof may not be provided.

It will be understood that when an element is referred to as being "connected" or "coupled" to another element, it can be directly connected or coupled to the other element or intervening elements may be present. In contrast, when an element is referred to as being "directly connected" or "directly coupled" to another element, no intervening elements are present. It will be understood that when an element such as a layer, film, region, or substrate is referred to as being "on" another element, it can be directly on the other element or intervening element(s) may also be present. In contrast, when an element is referred to as being "directly on" another element, no intervening elements are present. Other words used to describe the relationship between elements or layers should be interpreted in a like fashion (e.g., "between" versus "directly between," "adjacent" versus "directly adjacent," "on" versus "directly on"). As used herein, the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be alternatively termed a second element, component, region, layer or section without departing from the teachings of the example embodiments.

Spatially relative terms, such as "beneath," "below," "lower," "above," "upper", "under", "over", "on", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures were to be turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of", "one of", "selected from", "at least one selected from", and "one selected from", when preceding a list of elements, modify the entire list of elements and do not modify the individual elements of the list.

Example embodiments of the present disclosure are described herein with reference to cross-sectional illustrations that are schematic illustrations of idealized embodiments of example embodiments and/or their intermediate structures. As such, variations in the shapes of embodiments depicted in the illustrations as a result of, for example, manufacturing techniques and/or tolerances, are to be expected. Thus, example embodiments of the present disclosures should not be construed as being limited to the particular shapes of regions illustrated herein, but are to include deviations in shapes and dimensions that may result, for example, from manufacturing.

Unless otherwise defined, all terms (including technical and scientific terms) used herein have the same meaning as commonly understood by those having ordinary skill in the art to which example embodiments of the present disclosures belong. It will be further understood that terms, such as those defined in commonly-used dictionaries, should be interpreted as having a meaning that is consistent with their meaning in the context of the relevant art and will not be interpreted in an idealized or overly formal sense unless expressly defined as such herein.

As used herein, the term "ions" may refer to an ionic or charged form of an element, polyatomic cluster, or compound. The ion may be negatively charged (anionic) or positively charged (cationic). Non-limiting examples of a sulfur ion may include a sulfur anion ($S^{2-}$). Non-limiting examples of a halogen ion may include a halide anion, such as fluoride ($F^-$), chloride ($Cl^-$), bromide ($Br^-$), or iodide ($I^-$). As used herein, the term "contained" may equivalently refer to "included in", "comprised in", "positioned in", or "located in", as will be understood from the usage context.

Figure 2A:
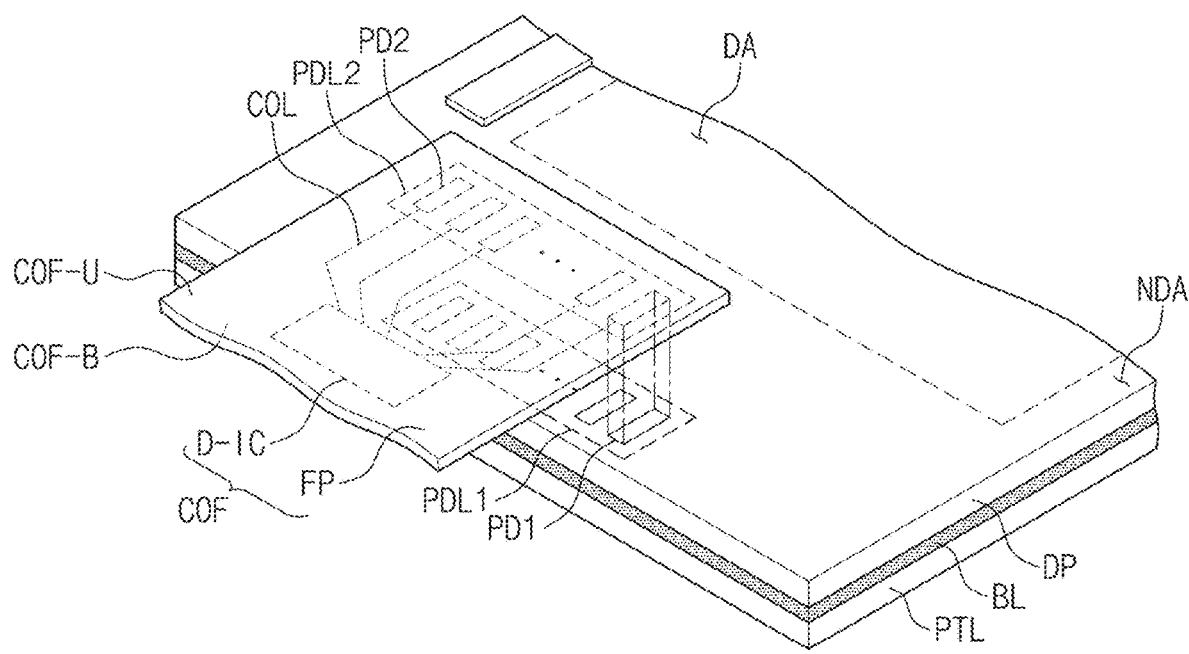
FIG. 2A is an enlarged perspective view illustrating a portion of a display device according to an embodiment of the present disclosure.
Figure 2B:
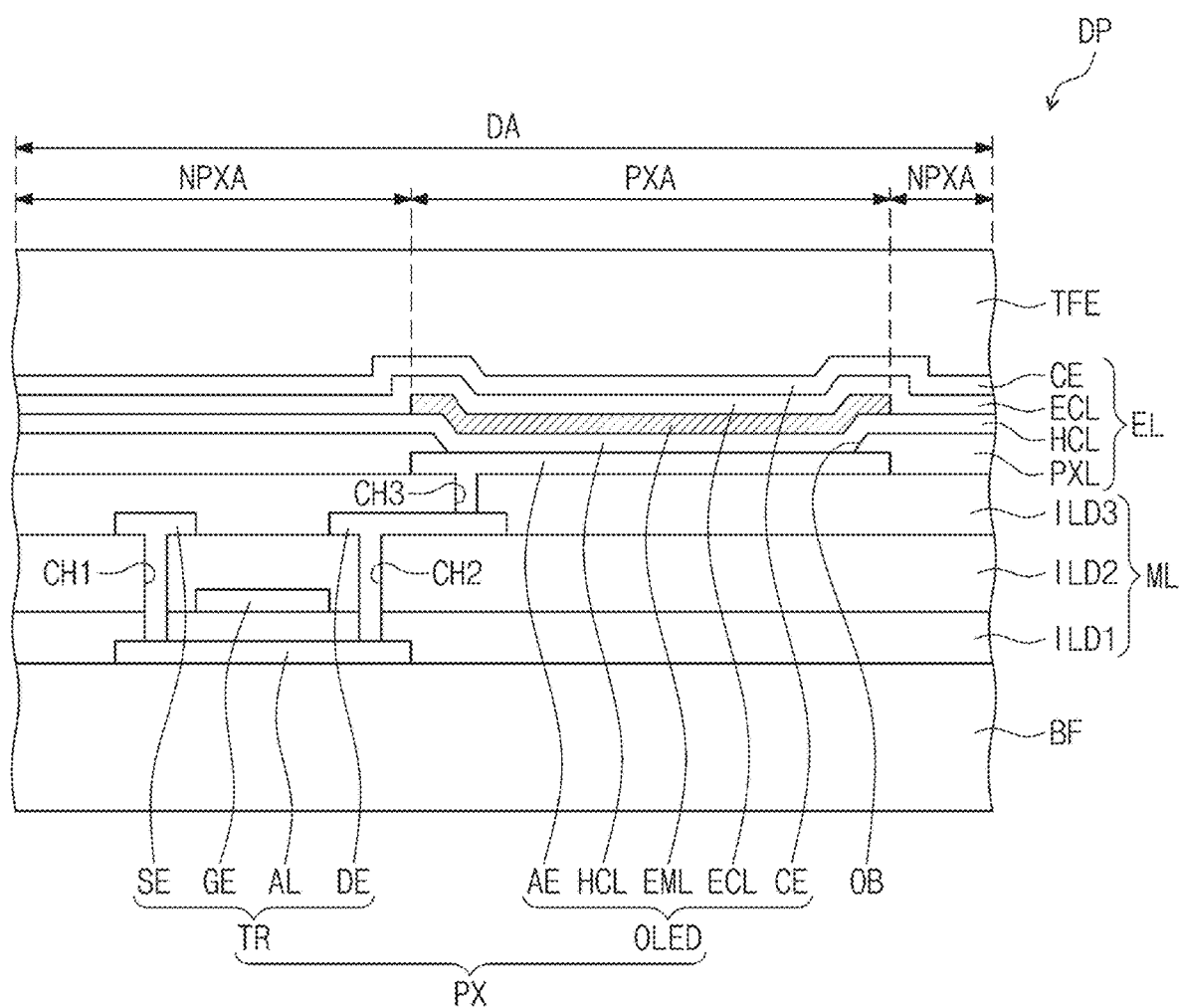
FIG. 2B is a sectional view illustrating a display panel according to an embodiment of the present disclosure.
Figure 2C:
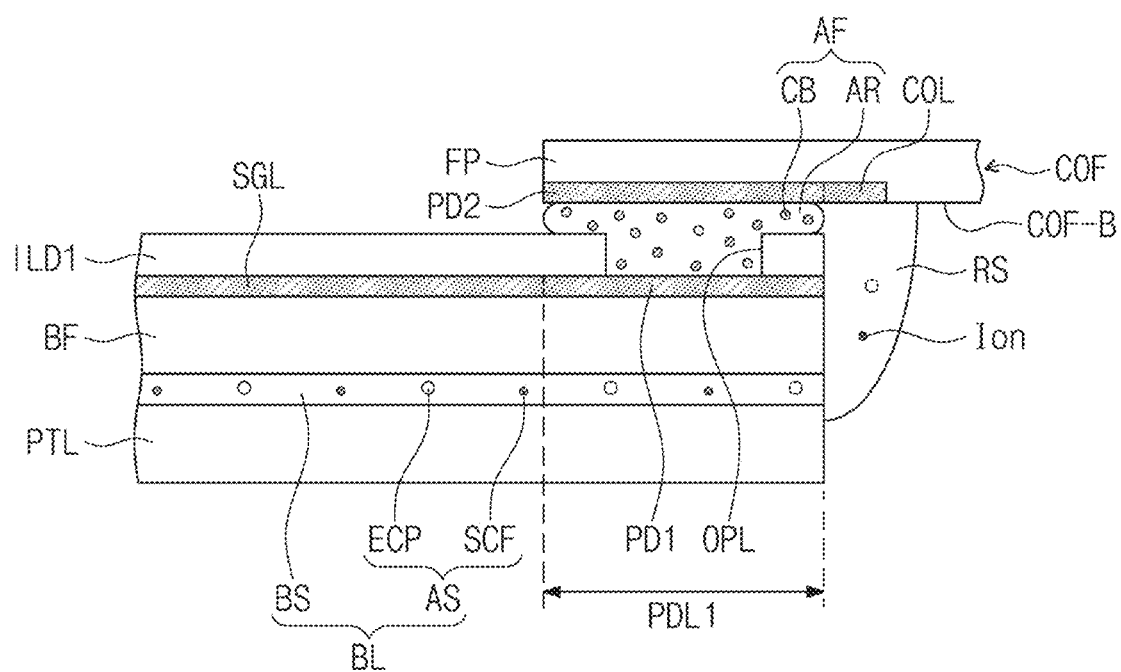
FIG. 2C is a sectional view illustrating a portion of a display device according to an embodiment of the present disclosure.

FIG. 1 is a perspective view illustrating a display device according to an embodiment of the present disclosure. FIG. 2A is an enlarged perspective view illustrating a portion of a display device according to an embodiment of the present disclosure. FIG. 2B is a sectional view illustrating a display panel according to an embodiment of the present disclosure. FIG. 2C is a sectional view illustrating a portion of a display device according to an embodiment of the present disclosure. Hereinafter, a display device EA according to an embodiment of the present disclosure will be described with reference to FIGS. 1, 2A, 2B, and 2C.

The display device EA may include a window member WM, a display panel DP, a driving circuit COF, a circuit substrate BC, an adhesive member BL, a protection member PTL, a resin member RS, and a housing member HM.

The window member WM may be on or over the display panel DP. The window member WM may protect the display panel DP from an external impact, and/or may prevent or reduce the risk of a contamination material (a contaminant) entering the display panel DP. The window member WM may be formed of a transparent material to allow an optical image to be emitted to the outside. For example, the window member WM may include or be formed of glass, sapphire, plastic, and/or the like. The window member WM is illustrated to be a single layer, but in some embodiments, the window member WM may include a plurality of layers. In some embodiments, although not shown, the window member WM may further include a bezel region, which may cover or veil a non-display region NDA (to be described below).

The display panel DP may display an image in response to an electrical signal. The display panel DP may include a display region DA and a non-display region NDA. The display region DA may be defined as the region over which an image provided by the display panel DP is displayed, whereas the non-display region NDA may be defined as the region (one or more regions) surrounding, adjacent to, or enclosing the display region DA. However, embodiments of the present disclosure are not limited to this example, and in some embodiments, the shape of the non-display region NDA may be modified or variously changed.

The display panel DP may be below the window member WM. The display panel DP may generate an image and then may provide the image to the window member WM.

In some embodiments, the display panel DP may be an organic light emitting display panel, a liquid crystal display panel, a plasma display panel, an electrophoretic display panel, a microelectromechanical system (MEMS) display panel, an electrowetting display panel, and/or the like. Hereinafter, an example, in which the display panel DP is an organic light emitting display panel, will be described. However, embodiments of the present disclosure are not limited to this example, and various types or kinds of display panels may be used to realize the present disclosure.

The display panel DP may include a driving circuit GDC, a plurality of signal lines SGL, a pixel pad portion PDL1, and a plurality of pixels PX. The pixels PX may be positioned in the display region DA. Each pixel PX of the plurality of pixels may include an organic light emitting element and a pixel driving circuit connected thereto.

The display panel DP may include a base layer BF, a circuit layer ML, a light emitting device layer EL, and a thin encapsulation layer TFE. In some embodiments, the circuit layer ML may include the driving circuit GDC, the signal lines SGL, the pixel pad portion PDL1, and the pixel driving circuit.

The driving circuit GDC may include a gate driving circuit. The gate driving circuit may generate a plurality of gate signals and may sequentially output the gate signals to a plurality of gate lines GL to be described below. The gate driving circuit may further output other (additional) control signals to the pixel driving circuit.

The signal lines SGL may include data lines DL, a power line PL, and/or a control signal line CSL, in addition to the gate lines GL. (Each of) the gate lines GL may be connected to (each of the plurality of) the pixels PX, respectively, and (each of) the data lines DL may be connected to (each of the plurality of) the pixels PX, respectively. Each power line PL may be connected to (each of the plurality of) the pixels PX, respectively. The control signal line CSL may be used to provide control signals to the gate driving circuit. The signal lines SGL may be overlapped with (e.g., at least partially vertically adjacent with) the display region DA and the non-display region NDA (e.g, when viewed in a plan view).

The pixel pad portion PDL1 may be positioned in the non-display region NDA. The pixel pad portion PDL1 may include a plurality of pads PD1. Each of the pads PD1 may be connected to a corresponding pixel PX of the plurality of pixels. In some embodiments, some of the pads PD1 may be connected to the plurality of pixels PX, while the others of the pads PD1 may be connected to the driving circuit GDC. The pads PD1 may be coupled to the driving circuit COF.

However, embodiments of the present disclosure are not limited to the above example, and in some embodiments, the signal lines SGL may be positioned on or in a region different (separate) from the pixel pad portion PDL1, along with the pads PD1, and may not be covered or veiled by an insulating layer. Here, the pixel pad portion PDL1 may refer to a region on which the pads PD1 are positioned, but embodiments of the present disclosure is not limited thereto.

The pads PD1 may be overlapped with (e.g., located in) the non-display region NDA, and may be connected to ends of the signal lines SGL (e.g., when viewed in a plan view). The pixel pad portion PDL1 may be coupled to at least a portion of the driving circuit COF and may be electrically connected to the circuit substrate BC through the driving circuit COF.

Referring to FIG. 2A, the driving circuit COF may include a flexible circuit substrate FP, a driving chip D-IC, a driving pad portion PDL2, and a plurality of driving lines COL. The driving pad portion PDL2 may include a plurality of driving pads PD2. The driving circuit COF may include a top surface COF-U and a bottom surface COF-B.

In the present embodiment, the driving pad portion PDL2 may be or include an opening, which is formed on a bottom surface of the flexible circuit substrate FP to expose the driving pads PD2. The bottom surface of the flexible circuit substrate FP may be defined as the bottom surface COF-B of the driving circuit COF.

The flexible circuit substrate FP may be flexible. Thus, the flexible circuit substrate FP may be provided in any suitable shape that is optimized for the purpose and shape of the display panel DP, e.g., when installed in an electronic device.

The driving chip D-IC may be mounted on the flexible circuit substrate FP in a chip-on-film (COF) manner. The driving chip D-IC may include driving elements (e.g., a data driving circuit) for driving the pixels PX.

The driving pads PD2 may be exposed on the bottom surface COF-B of the driving circuit COF. Each of the exposed driving pads PD2 may be coupled to a corresponding one of the pads PD1. In some embodiments, the pads PD1 may be positioned on the base layer BF. An end or side of each of the driving pads PD2 may be connected to a corresponding one of the driving lines COL. The driving lines COL may be coupled to the driving chip D-IC. Thus, the pixels PX may be connected to the driving chip D-IC and may receive data signals from the driving chip D-IC. The driving pads PD2 may be formed of or include a metallic material. In FIG. 2A, the driving pads PD2, the driving lines COL, and the driving chip D-IC are depicted on the bottom surface COF-B by dotted lines.

Although the display device EA is illustrated to include one driving circuit COF, embodiments of the present disclosure are not limited thereto. For example, the display device EA may include a plurality of driving circuits COF, each being coupled to the display panel DP.

Referring to FIG. 2B, the base layer BF may be a base layer on which other elements of the display panel DP are layered or positioned. The base layer BF may include or be formed of at least one selected from a plastic substrate, a glass substrate, and a substrate formed of an organic/inorganic composite material. In some embodiments, the base layer BF may be a stack including a plurality of insulating layers (e.g., the insulated layers are stacked or laminated with each other).

The circuit layer ML may be on the base layer BF. The circuit layer ML may include a thin film transistor TR and a plurality of insulating layers ILD1, ILD2, and ILD3. In some embodiments, the circuit layer ML may include the thin film transistor TR and a capacitor, which are electrically connected to the light emitting device layer EL. The circuit layer ML may be electrically connected to the light emitting device layer EL to control a light-emission operation of the light emitting device layer EL.

The light emitting device layer EL may be on the circuit layer ML. The light emitting device layer EL may include an organic light emitting device OLD and a pixel definition layer PXL. The light emitting device layer EL may emit an optical image in response to electrical signals, which are transmitted through the thin film transistor TR and the capacitor of the circuit layer ML. In some embodiments, the structure of the light emitting device layer EL may be varied or changed. The description that follows will refer to an example of the light emitting device layer EL including an organic light emitting device.

The pixel PX displaying an image may be positioned on the base layer BF. The pixel PX may include the thin film transistor TR and the organic light emitting device OLD. The thin film transistor TR may be an element included in the circuit layer ML. The organic light emitting device OLD may be an element included in the light emitting device layer EL.

The display region DA (e.g., see FIG. 1) according to an embodiment of the present disclosure may include a light-emitting region PXA and a non-light-emitting region NPXA, which are adjacent to each other. When viewed in a plan view, the non-light-emitting region NPXA may enclose, surround (e.g., on the perimeter), or be planarly adjacent to the light-emitting region PXA. In some embodiments, a plurality of light-emitting regions PXA may be provided in the display region DA. The light-emitting regions PXA may be spaced apart from each other, and the non-light-emitting region NPXA may be adjacent to the light-emitting regions PXA. In FIG. 2B, one light-emitting region PXA is illustrated as an example.

The thin film transistor TR may include a semiconductor pattern AL, a control electrode GE, an input electrode SE, and an output electrode DE.

The semiconductor pattern AL of the thin film transistor TR and a first insulating layer ILD1 may be on the base layer BF. The first insulating layer ILD1 may cover the semiconductor pattern AL.

The control electrode GE and a second insulating layer ILD2 may be on the first insulating layer ILD1. The second insulating layer ILD2 may cover the control electrode GE. Each of the first insulating layer ILD1 and the second insulating layer ILD2 may include an organic layer and/or an inorganic layer. Each of the first insulating layer ILD1 and the second insulating layer ILD2 may include a plurality of thin films.

The input electrode SE, the output electrode DE, and a third insulating layer ILD3 may be on the second insulating layer ILD2. The third insulating layer ILD3 may cover the input electrode SE and the output electrode DE.

The input electrode SE and the output electrode DE may be connected to the semiconductor pattern AL, respectively, through a first penetration hole CH1 and a second penetration hole CH2, which are formed to penetrate the first insulating layer ILD1 and the second insulating layer ILD2.

The organic light emitting device OLD and the pixel definition layer PXL may be on the third insulating layer ILD3. The organic light emitting device OLD may include an anode electrode AE, an emission pattern EML, a cathode electrode CE, a hole transport region HCL between the anode electrode AE and the emission pattern EML, and an electron transport region ECL between the cathode electrode CE and the emission pattern EML.

The anode electrode AE may be connected to the output electrode DE through a third penetration hole CH3 penetrating the third insulating layer ILD3.

The pixel definition layer PXL may be on the third insulating layer ILD3. An opening OB may be defined in the pixel definition layer PXL to expose at least a portion of the anode electrode AE. The anode electrode AE may span or be on a region corresponding to the light-emitting region PXA, through which light from the organic light emitting device OLD is emitted. In some embodiments, the opening OB may be defined in a region corresponding to the light-emitting region PXA.

The hole transport region HCL may be on the anode electrode AE to cover the anode electrode AE and the pixel definition layer PXL. The hole transport region HCL may include at least one selected from a hole injection layer, a hole transport layer, and a single layer having both of a hole injection function and a hole transport function.

The emission pattern EML may be on the hole transport region HCL. The emission pattern EML may be formed of or include at least one selected from fluorescent materials, phosphorescence materials, and quantum dots. The emission pattern EML may generate mono-chromatic light or multi-chromatic light. In some embodiments, the light-emitting region PXA may be overlapped with (may cover or be on) the emission pattern EML, when viewed in a plan view.

The electron transport region ECL may be on the emission pattern EML to cover the emission pattern EML and the hole transport region HCL. The electron transport region ECL may include or be formed of at least one selected from an electron transport material and an electron injection material. The electron transport region ECL may be an electron transport layer containing an electron transport material or a single (e.g., combined) electron injection/transport layer containing an electron transport material and an electron injection material.

The cathode electrode CE may be on the electron transport region ECL and may face the anode electrode AE. The cathode electrode CE may include or be formed of a material having a small work-function, and hence may be used for easy injection of electrons.

The materials included in or used to form the cathode electrode CE and the anode electrode AE may be suitably varied, depending on the light-emitting method of the display panel DP. For example, in the case where the display panel DP is a top-emission display panel, the cathode electrode CE may be a transparent electrode, and the anode electrode AE may be a reflective electrode. Alternatively, in the case where the display panel DP is a bottom emission display panel, the cathode electrode CE may be a reflective electrode, and the anode electrode AE may be a transparent electrode. The structure of the organic light emitting device in the display panel DP is not particularly limited, and the structure of the organic light emitting device may be variously changed.

The thin encapsulation layer TFE may be on the cathode electrode CE. The thin encapsulation layer TFE may fully cover the cathode electrode CE and may hermetically seal the organic light emitting device OLD. The thin encapsulation layer TFE may protect the organic light emitting device OLD from moisture or any other contamination materials. The thin encapsulation layer TFE may be formed by a deposition process.

The thin encapsulation layer TFE may include at least one inorganic layer and/or at least one organic layer. The inorganic layer may include or be formed of at least one selected from, for example, aluminum oxide, silicon oxide, silicon nitride, silicon oxynitride, silicon carbide, titanium oxide, zirconium oxide, and zinc oxide.

The organic layer may include or be formed of at least one selected from, for example, epoxy, polyimide (PI), polyethylene terephthalate (PET), polycarbonate (PC), polyethylene (PE), and polyacrylate. In some embodiments, the thin encapsulation layer TFE may include a plurality of inorganic layers spaced apart from each other, with one or more organic layers interposed therebetween, and in this case, the organic layer may be covered with at least one of the inorganic layers.

FIG. 2C is an enlarged sectional view illustrating a region, in which the display panel DP and the driving circuit COF are coupled to each other.

In the present embodiment, the pixel pad portion PDL1 may be formed on one of the insulating layers ILD1, ILD2, and ILD3 of the display panel DP to correspond to an opening OPL exposing the pads PD1. For example, the insulating layers ILD1, ILD2, and ILD3 may cover the signal lines SGL in regions other than the pixel pad portion PDL1. That is, the insulating layers may electrically disconnect (e.g., may insulate) the signal lines SGL from the outside, while the pixel pad portion PDL1 including the pads PD1 may be exposed by the insulating layer (e.g., may be exposed in a region not covered by the insulating layers), and may be coupled to an external device.

The pads PD1 may be on the base layer BF and may be exposed to the outside through the opening OPL, which is defined in the first insulating layer ILD1. The exposed pads PD1 may be coupled to the driving pads PD2. The pads PD1 may be positioned on the same layer and/or may be at the same level (plane) as at least one of the signal lines SGL.

However, embodiments of the present disclosure are not limited to this example or a specific embodiment. For example, the pads PD1 may be on the first insulating layer ILD1 and may be exposed through an opening penetrating the second insulating layer ILD2. Alternatively, the pads PD1 may be on the second insulating layer ILD2 and may be exposed through an opening penetrating the third insulating layer ILD3.

The present embodiment is an example in which the pad PD1 and the signal line SGL are connected to constitute a single object (e.g., are co-planar), but embodiments of the present disclosure are not limited to this example. For example, the pad PD1 may be stacked on the signal line SGL.

In some embodiments, an anisotropic conductive film (ACF) AF may be used for coupling between the pads PD1 and the driving pads PD2. The anisotropic conductive film AF may include an adhesive resin AR and a plurality of conductive balls CB dispersed in the adhesive resin AR. The anisotropic conductive film AF may be between the pads PD1 and the driving pads PD2, and the pads PD1 and the driving pads PD2 may be coupled to each other by a thermocompression process performed on the anisotropic conductive film AF.

The adhesive member BL may be between the display panel DP and the protection member PTL, and the display panel DP and the protection member PTL may be coupled to each other by the adhesive member BL. In some embodiments, the adhesive member BL may include an adhesive agent BS and an anti-static agent AS.

The adhesive agent BS may be, for example, a pressure sensitive adhesive agent (PSA), an optical clear adhesive agent (OCA), or an optical clear resin (OCR). In addition, the adhesive agent BS may include at least one photo- or thermo-curable adhesion material, but embodiments of the present disclosure are not limited to a material for the adhesive agent BS.

The anti-static agent AS may include a conductive polymer ECP and a surfactant SCF. The conductive polymer ECP and the surfactant SCF may be dispersed in the adhesive agent BS and may each be provided as a compound.

The conductive polymer ECP may include a material having an anti-static function. For example, the conductive polymer ECP may include at least one selected from polyaniline, polypyrrole, and polythiophene.

The surfactant SCF may include at least one selected from anionic surfactants (e.g., alkyl sulfone ester and/or alkyl aryl sulfone), cationic surfactants (e.g., ammonium and/or imidazolidone), amphoteric surfactants (e.g., alky betaine, alky imidazolidone, and/or alkyl alanine), and non-ionic materials (e.g., sorbitan esters of fatty acids and/or glycerol esters of fatty acids), but embodiments of the present disclosure are not limited thereto.

In some embodiments, the conductive polymer ECP may include sulfur ions. The anti-static agent AS may include at least one selected from sulfur ions and halogen ions. The halogen ions may include at least one selected from, for example, fluorine (F), chlorine (CI), bromine (Br), and iodine (I) ions. The sulfur ions and halogen ions may each be included in contents (amounts or concentrations) within a specific range with respect to a total weight of the adhesive agent. This will be described in more detail below.

In some embodiments, when the adhesive member BL having an anti-static function is between the display panel DP and the protection member PTL, it may be possible to prevent or reduce a stain failure of the display panel DP, which may be caused by an electrostatic effect (e.g., discharge) between the display panel DP and the protection member PTL. Thus, it may be possible to provide the display device EA with improved reliability.

The protection member PTL may be below the display panel DP. The protection member PTL may include one or more functional layers to assist in operation of the display panel DP. For example, the protection member PTL may include at least one selected from a supporting layer, an impact absorption layer, a heat dissipation layer, and a light blocking layer.

The supporting layer may support the display panel DP. The supporting layer may include or be formed of at least one thermoplastic resin. For example, the supporting layer may be formed of polyethylene terephthalate (PET), which is superior in terms of fatigue strength, electric characteristics, and heat-resistant property and is less vulnerable to temperature and humidity.

The impact absorption layer may include or be formed of a synthetic resin foam. The impact absorption layer may be provided in the form of a matrix layer with a plurality of pores. Due to the plurality of pores, the impact absorption layer may have a porous structure, and thus, an external impact exerted on the display device EA may be easily absorbed by the impact absorption layer.

The light blocking layer may prevent or limit a user from viewing elements on the bottom surface of the display panel DP through the window member WM. For example, the light blocking layer may prevent or reduce light from propagating from the bottom surface of the display panel DP to the outside.

The resin member RS may be below the driving circuit COF. The resin member RS may cover at least a portion of the bottom surface COF-B of the driving circuit COF. As shown in FIG. 2C, each of the driving lines COL may include at least a portion that protrudes from a side surface of the display panel DP and is exposed to the outside of the driving circuit COF. The resin member RS may cover the exposed portions of the driving lines COL.

The resin member RS may be in contact with the adhesive member BL adjacent to the driving circuit COF. Thus, the resin member RS may be used as an ion path, allowing ions in the adhesive member BL to be coupled to the driving lines COL. The resin member RS may include or be formed of at least one photo- or thermo-curable material. In some embodiments, the resin member RS may include ions (Ion). The ions (Ion) may be of the same as the ions in the anti-static agent AS. This will be described in more detail below.

Since the display device EA includes the resin member RS, it may be possible to prevent or reduce external oxygen and/or moisture from entering the display panel DP. In addition, it may be possible to increase a coupling strength between the display panel DP and the driving circuit COF.

The housing member HM may contain or hold the display panel DP. The housing member HM may be coupled with the window member WM to define an outer appearance of (e.g., surround or encase) the display device EA. The housing member HM may absorb impact exerted from the outside and/or may prevent or reduce a contamination material and/or moisture from infiltrating the display device EA, and thus, internal elements in the housing member HM may be protected from the contamination material and/or moisture. In some embodiments, the housing member HM may include a plurality of container members coupled to each other.

Figure 3A:
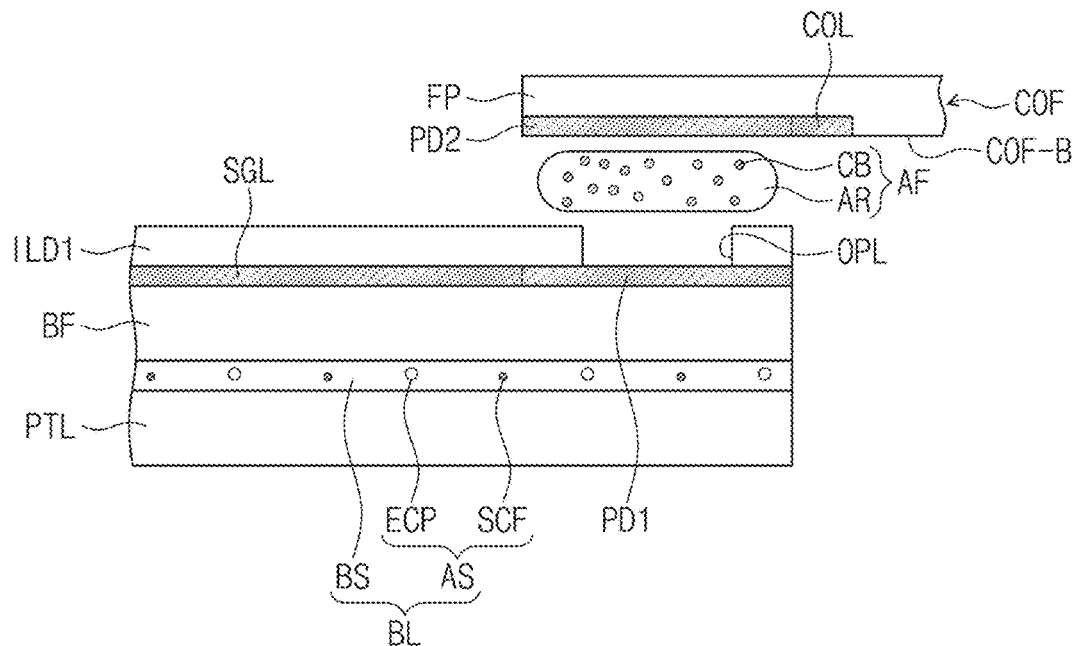
FIGS. 3A to 3C are sectional views illustrating a portion of a display device according to an embodiment of the present disclosure.
Figure 3B:
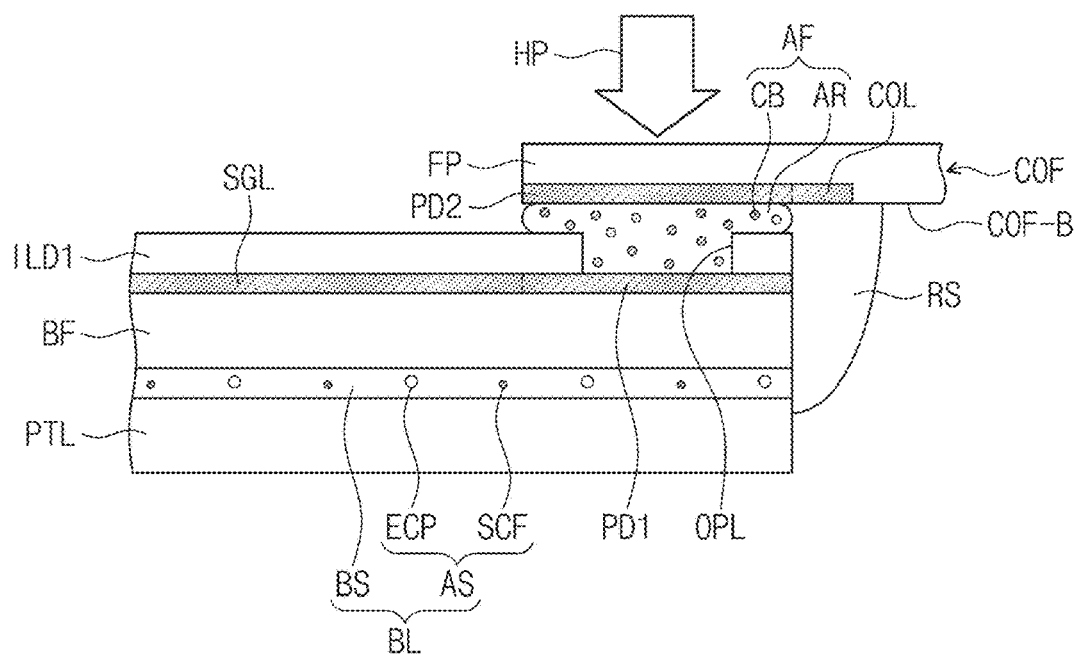
Figure 3C:
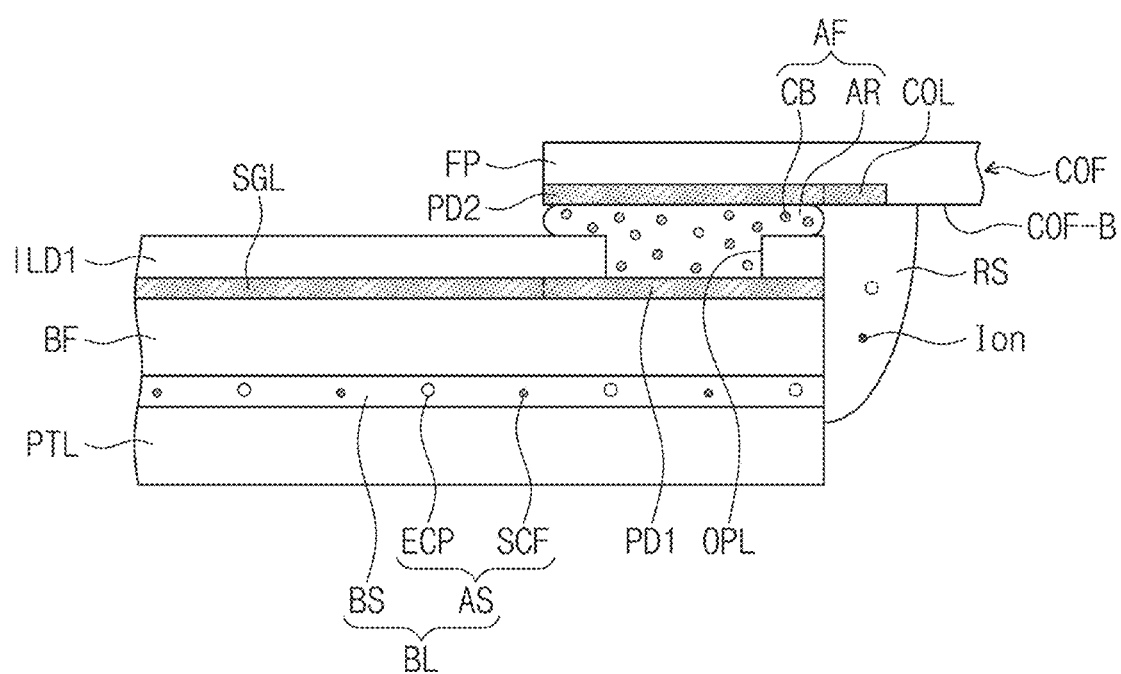
Figure 4A:
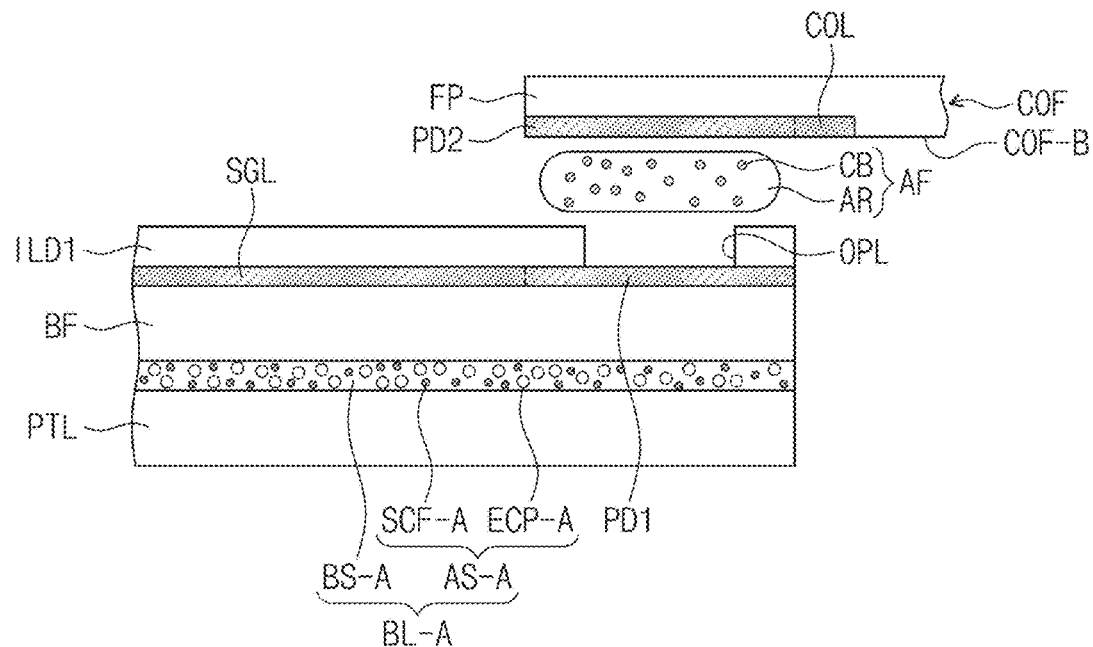
FIGS. 4A to 4C are sectional views illustrating a portion of a display device according to a comparative embodiment.
Figure 4B:
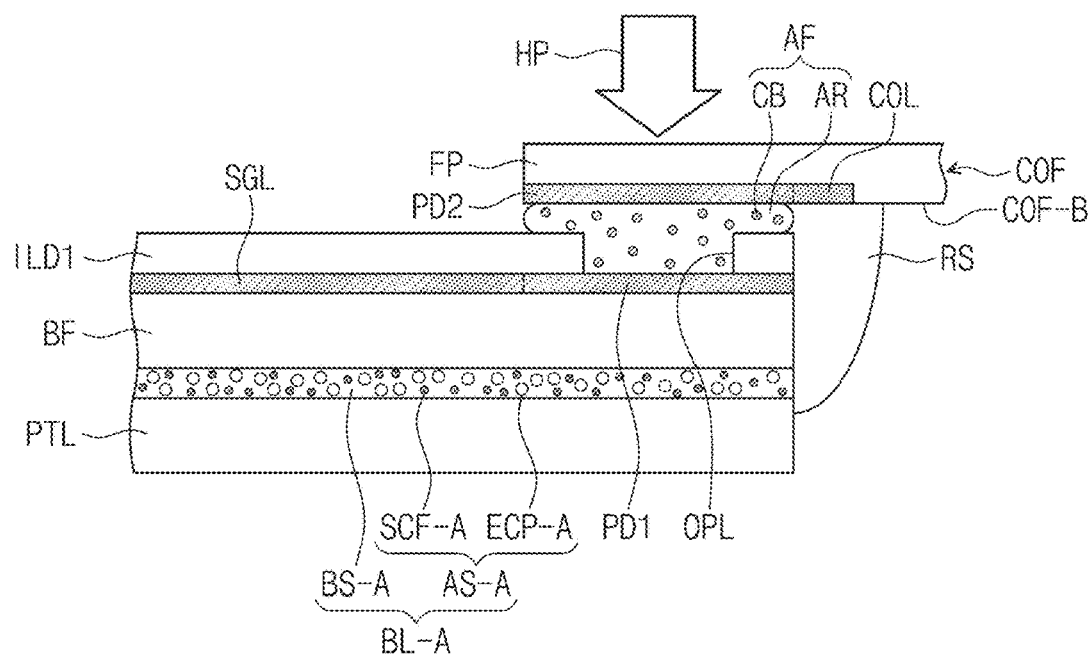
Figure 4C:
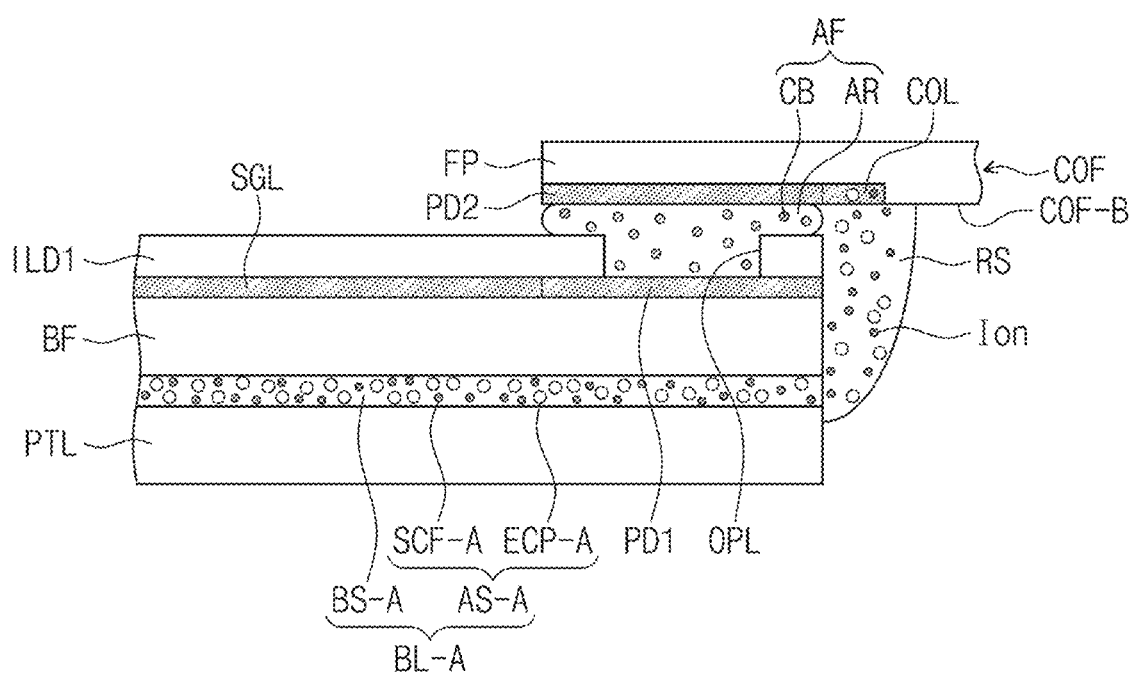

FIGS. 3A to 3C are sectional views illustrating a portion of a display device according to an embodiment of the present disclosure. FIGS. 4A to 4C are sectional views illustrating a portion of a display device according to a comparative embodiment.

FIGS. 3A to 3C illustrate sequential steps of a thermo-compression process, which is performed on the anisotropic conductive film AF to couple the pads PD1 to the driving pads PD2.

The pads PD1 may be exposed through the opening OPL defined in the first insulating layer ILD1, and the driving pads PD2 may be exposed on the bottom surface COF-B of the driving circuit COF. The anisotropic conductive film AF may be positioned between the exposed pads PD1 and the exposed driving pads PD2. Next, the pads PD1 and the driving pads PD2 may be physically coupled to each other through a thermocompression process. In FIGS. 3A to 3C, a connection portion between the driving pad PD2 and the driving line COL is depicted by a dotted line.

When a thermocompression process HP is performed on the anisotropic conductive film AF, pressure may be exerted on the adhesive member BL. Since the resin member RS is in contact with the adhesive member BL adjacent to the driving circuit COF, some of the ions contained in the anti-static agent AS may migrate into the resin member RS. As a result, some ions (Ion) from the adhesive member BL may migrate in the resin member RS, as shown in FIG. 3C.

In some embodiments, the conductive polymer ECP may include sulfur ions. The anti-static agent AS may include at least one selected from sulfur ions and halogen ions. For example, the halogen ions may include at least one selected from fluorine (F), chlorine (CI), bromine (Br), and iodine (I) ions.

In some embodiments, a content of halogen ions with respect to a total weight of the adhesive agent BS may range from about 1 ppm (mg/kg) to about 1000 ppm. In addition, a content of sulfur ions with respect to the total weight of the adhesive agent BS may range from about 100 ppm to about 500 ppm.

In the case where the content of halogen ions with respect to the total weight of the adhesive agent BS is less than about 1 ppm, the anti-static agent AS may not provide a sufficient anti-static function. That is, an electrostatic effect (e.g., discharge) may occur between the base layer BF and the protection member PTL. In this case, a user may recognize a stain of the display panel DP (e.g., see FIG. 1). That is, a stain failure may occur. Similarly, in the case where the content of sulfur ions with respect to the total weight of the adhesive agent BS is less than about 100 ppm, a stain failure may be caused by static electricity.

In the case where the content of halogen ions with respect to the total weight of the adhesive agent BS is greater than about 1000 ppm, some of the ions in the anti-static agent AS may migrate into the resin member RS during the thermo-compression process HP on the anisotropic conductive film AF. Similarly, in the case where the content of sulfur ions with respect to the total weight of the adhesive agent BS is greater than about 500 ppm, some of the ions in the anti-static agent AS may migrate into the resin member RS.

The ions (Ion) migrated into the resin member RS may be in contact with at least one of the driving pads PD2 and the driving lines COL. This will be described with reference to comparative embodiments in FIGS. 4A to 4C. In the description of FIGS. 4A to 4C, elements that are the same or substantially similar as those in FIGS. 3A to 3C will be identified using the same or similar reference number without repeating an overlapping description thereof.

In the comparative embodiments of FIGS. 4A to 4C, an anti-static agent AS-A in an adhesive member BL-A may contain halogen ions. A content of halogen ions in the anti-static agent AS-A with respect to a total weight of an adhesive agent BS-A may be greater than about 1000 ppm.

In this case, during the thermocompression process HP on the anisotropic conductive film AF (FIG. 4B), some ions (Ion) in the anti-static agent AS-A may migrate into the resin member RS, and the migrated ions (Ion) in the resin member RS may be in contact with at least one of the driving pads PD2 and the driving lines COL (FIG. 4C). In this case, the driving pads PD2 and/or the driving lines COL may be corroded by the migrated ions (Ion), because the driving pads PD2 and the driving lines COL are formed of a metal-containing material.

Figure 5:
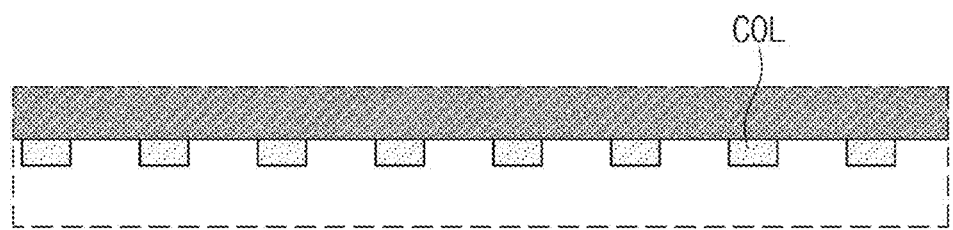
FIG. 5 is a drawing showing a section of a driving circuit according to an embodiment of the present disclosure.
Figure 6A:
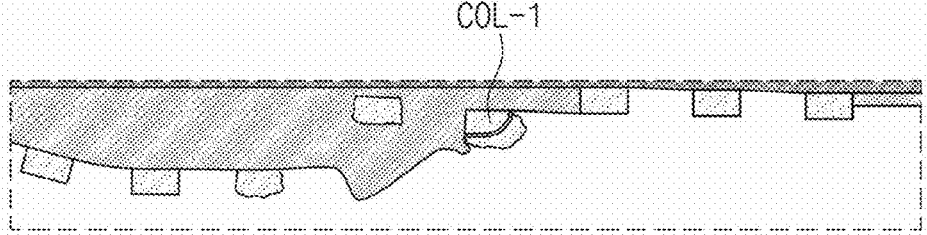
FIG. 6A is a drawing showing a section of a driving circuit according to a comparative embodiment.
Figure 6B:
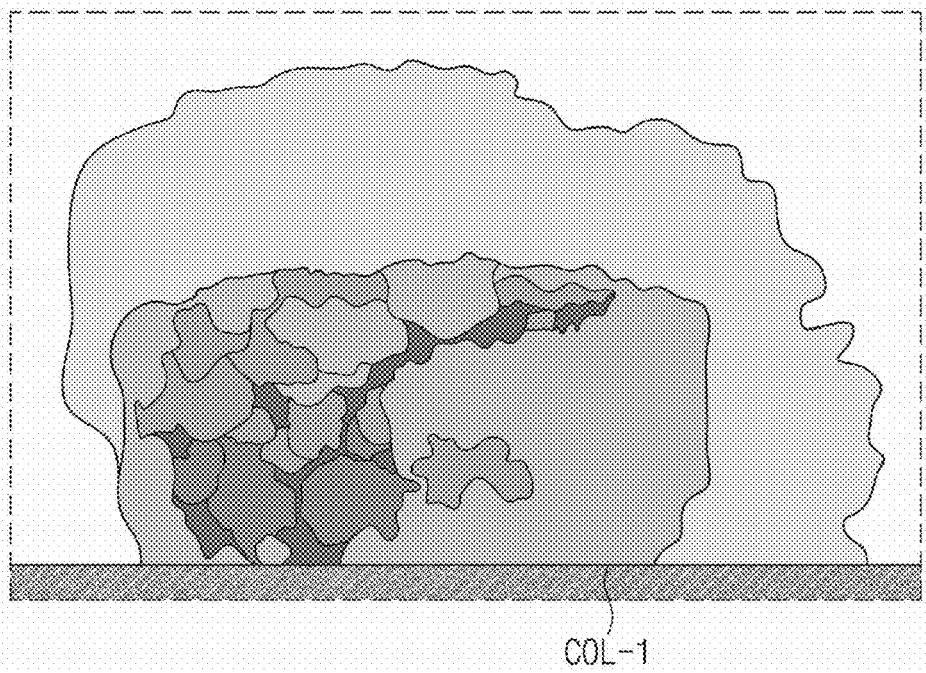
FIG. 6B is a drawing showing an enlarged shape of a driving line according to a comparative embodiment.
Figure 6C:
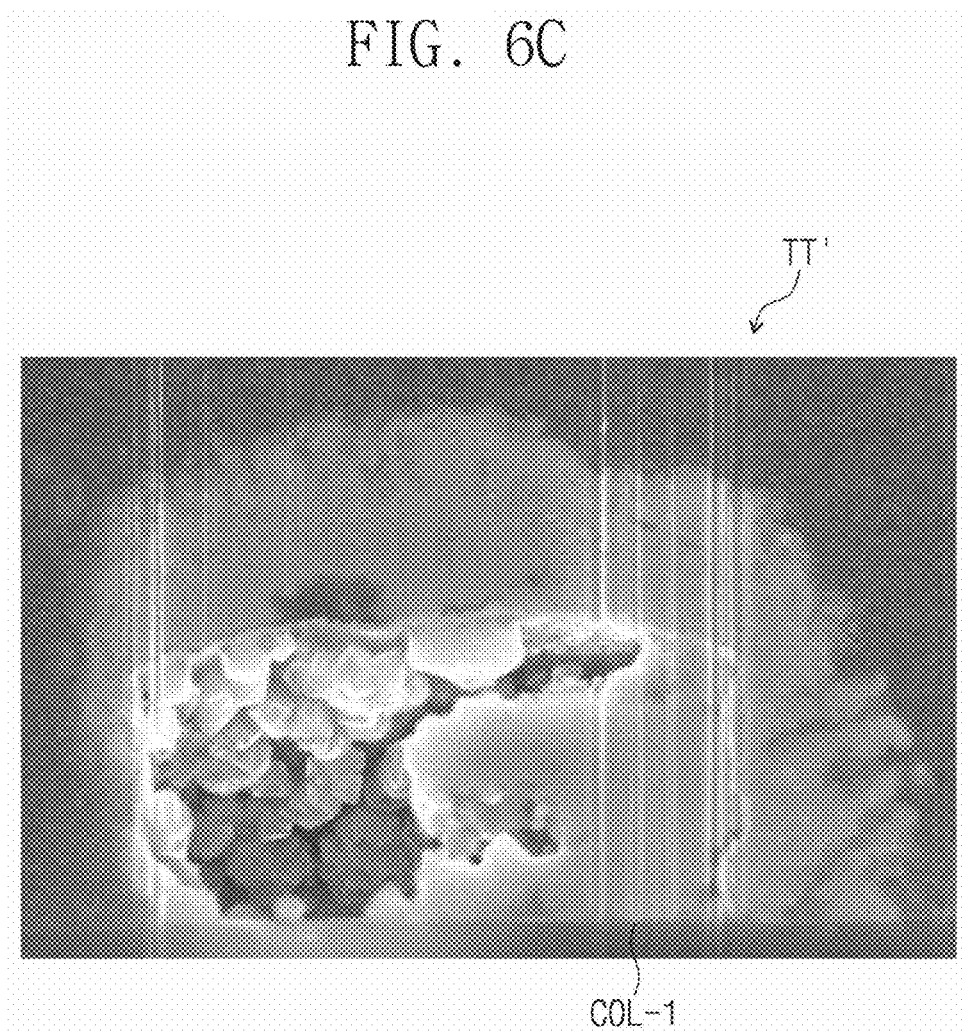

FIG. 5 is a drawing showing a cross-section of a driving circuit according to an embodiment of the present disclosure. FIG. 6A is a drawing showing a cross-section of a driving circuit according to a comparative embodiment. FIG. 6B is a drawing showing a cross-section of a driving circuit according to a comparative embodiment. FIG. 6B is a drawing showing an enlarged shape of a driving line according to a comparative embodiment.

FIG. 5 shows a vertical section of the driving lines COL according to an embodiment of the present disclosure. In the embodiment of FIG. 5, since a content of halogen ions contained in the anti-static agent AS with respect to a total weight of the adhesive agent BS is constrained to be within a range from about 1 ppm (mg/kg) to about 1000 ppm, the halogen ions contained in the anti-static agent AS may be prevented or limited from being in contact with the driving lines COL. Thus, it may be possible to prevent the driving lines COL from being corroded by ions contained in the adhesive member BL (e.g., see FIG. 3A).

Meanwhile, in the comparative embodiment of FIG. 6A, in the case where the content of halogen ions contained in the anti-static agent AS-A with respect to the weight of the adhesive agent BS-A is greater than about 1000 ppm, the driving lines COL-1 may be in contact with halogen ions contained in the anti-static agent AS-A, and may be corroded. In the case where the driving lines COL-1 are corroded as shown in FIG. 6B, an electrical disconnection may occur between the pixels PX and the driving chip D-IC (e.g., see FIG. 2A) and/or a short failure may be formed between adjacent driving lines COL-1.

FIGS. 7A to 7D are drawings showing cross-sections of a driving circuit according to a comparative embodiment and an example embodiment. FIGS. 7A to 7D show how the corrosion of the driving lines depends on a content of ions contained in the anti-static agent with respect to the adhesive agent.

Figure 7A:
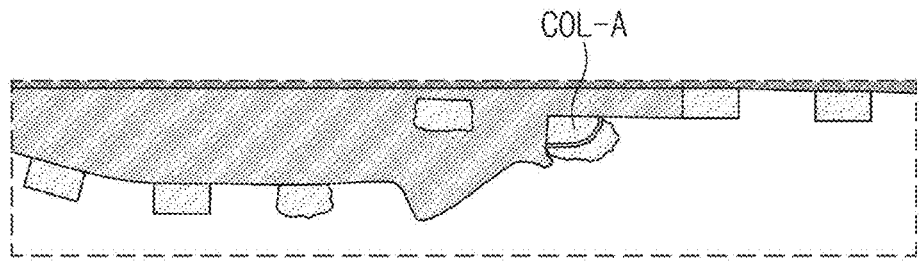
FIGS. 7A to 7D are drawings showing sections of a driving circuit according to a comparative embodiment.
Figure 7B:
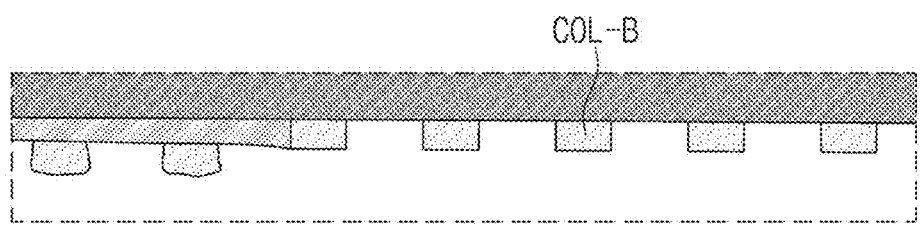
Figure 7C:
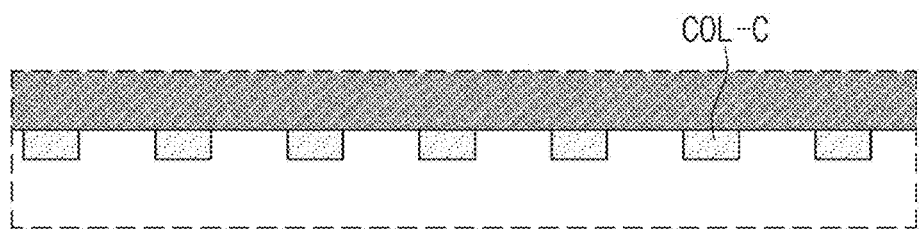
Figure 7D:
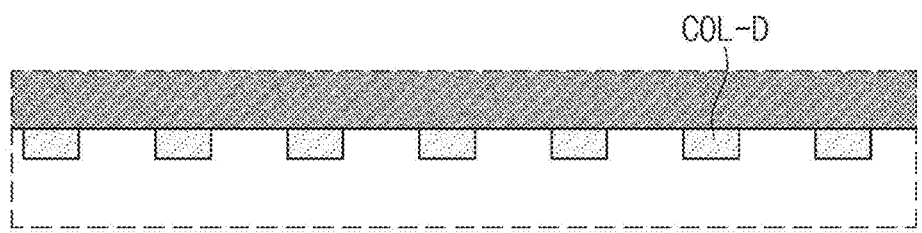

FIG. 7A shows a corrosion state of a driving line COL-A, which was obtained when a content of ions contained in the anti-static agent AS-A (e.g., see FIG. 4C) with respect to a total weight of the adhesive agent BS-A (e.g., see FIG. 4C) was greater than about 2500 ppm. FIG. 7B shows a corrosion state of a driving line COL-B, which was obtained when a content of ions contained in the anti-static agent AS-A with respect to a total weight of the adhesive agent BS-A was greater than about 1000 ppm and less than about 2500 ppm. FIG. 7C shows a corrosion state of a driving line COL-C, which was obtained when a content of ions contained in the anti-static agent AS with respect to a total weight of the adhesive agent BS (e.g., see FIG. 3C) was greater than about 100 ppm and less than about 1000 ppm. For example, the embodiment of FIG. 7C may be an embodiment of the present disclosure. FIG. 7D shows a corrosion state of a driving line COL-D, which was obtained when a content of ions contained in the anti-static agent AS-A with respect to a total weight of the adhesive agent BS-A (e.g., see FIG. 4C) was less than about 100 ppm.

TABLE 1

|  | First Condition | Second Condition | Third Condition |
|---|---|---|---|
| First Ion | <100 ppm | 100 ppm-1000 ppm | >1000 ppm |
| Second Ion | <1 ppm | 1 ppm-100 ppm | >100 ppm |
| Third Ion | <100 ppm | 100 ppm-500 ppm | >500 ppm |

TABLE 2

|  | First Condition | Second Condition | Third Condition |
|---|---|---|---|
| Surface resistance value | $\geq 1.0 \times 10^{13}\ \Omega$ | $2.0 \times 10^{12}\ \Omega\text{-}5.0 \times 10^{12}\ \Omega$ | $1.0 \times 10^{10}\ \Omega\text{-}1.0 \times 10^{12}\ \Omega$ |

Table 1 shows contents of first, second, and third ions, which are diversified according to three conditions in the anti-static agent AS with respect to the adhesive agent BS (e.g., see FIG. 2C). Here, the first, second, and third ions were fluorine, chlorine, and sulfur ions, respectively.

Table 2 shows surface resistance values, which were measured from an interface between the protection member PTL and the display panel DP (e.g., see FIG. 2C), under the first to third conditions of Table 1.

The anti-static agent AS according to an embodiment of the present disclosure may be provided to meet the second condition for fluorine, chlorine ions, and sulfur ions.

Referring to Table 2, this means that the protection member PTL and the display panel DP according to an embodiment of the present disclosure had a surface resistance value ranging from $2.0 \times 10^{12}\Omega$ to $5.0 \times 10^{12}\Omega$ in the interface therebetween.

In the case where the surface resistance value is greater than $1.0 \times 10^{13}\Omega$, the display panel DP may suffer from a stain failure caused by an electrostatic effect (discharge) between the protection member PTL and the display panel DP, even though the driving lines COL are intact. See e.g., FIG. 7D.

When the surface resistance value is reduced, it may be possible to more effectively reduce a remnant charging effect between the protection member PTL and the display panel DP and thereby to more effectively prevent the stain failure caused by static electricity. In the case where the surface resistance value is greater than $1.0 \times 10^{13}\Omega$, the anti-static agent AS may not have an anti-static function, and thus, a stain failure may occur in the display panel DP.

As shown in Table 2, when the first to third ions were prepared to meet the third condition, the protection member PTL and the display panel DP had the lowest surface resistance values (i.e., $1.0 \times 10^{10}\Omega$ to $1.0 \times 10^{12}\Omega$). However, the third condition induces corrosion in the driving lines because of sulfur ions or halogen ions. See e.g., FIGS. 7A-7B.

In the second condition, even when the content of halogen ions with respect to the total weight of the adhesive agent BS was constrained within a range from about 1 ppm (mg/kg) to about 1000 ppm and the content of sulfur ions with respect to the weight of the adhesive agent BS was constrained within a range from about 100 ppm to about 500 ppm, the surface resistance value was within a range from $2.0 \times 10^{12}\Omega$ to $5.0 \times 10^{12}\Omega$, which allows for a sufficient anti-static function. That is, in the embodiment of the present disclosure, it may be possible to prevent or reduce a stain failure from occurring by static electricity.

Furthermore, as shown in FIGS. 2C and 5, in the case where the content of ions is constrained within the above range, it may be possible to prevent sulfur ions or halogen ions contained in the anti-static agent AS from being in contact with the driving lines COL and thereby to prevent the driving lines COL from being corroded. That is, in the case where the content of ions is constrained within the above range, it may be possible to improve reliability of the display device EA (e.g., see FIGS. 1 and 7C).

According to some embodiments of the present disclosure, when halogen ions or sulfur ions contained in an anti-static agent are provided within a particular content range with respect to the weight of an adhesive agent, it may be possible to realize an adhesive member having an improved anti-corrosion property, and a display device including the same.

As used herein, the terms "use", "using", and "used" may be considered synonymous with the terms "utilize", "utilizing", and "utilized", respectively. Further, the use of "may" when describing embodiments of the present disclosure refers to "one or more embodiments of the present disclosure".

As used herein, the terms "substantially", "about", and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While example embodiments of the present disclosures have been particularly shown and described, it will be understood by those of ordinary skill in the art that variations in form and detail may be made therein without departing from the spirit and scope of the attached claims and equivalents thereof.

What is claimed is:

1. An adhesive member, comprising:
an adhesive agent; and
an anti-static agent dispersed in the adhesive agent, the anti-static agent comprising a conductive polymer comprising sulfur ions and a surfactant comprising sulfur ions and fluorine ions,
wherein a content of the fluorine ions with respect to a total weight of the adhesive agent ranges from 100 ppm (mg/kg) to 1000 ppm, and
a content of the sulfur ions with respect to the total weight of the adhesive agent ranges from 100 ppm to 500 ppm.

2. The adhesive member of claim 1, wherein the anti-static agent further comprises chlorine ions,
wherein a content of the chlorine ions with respect to the total weight of the adhesive agent ranges from 1 ppm to 100 ppm.

3. The adhesive member of claim 1, wherein the adhesive agent comprises at least one selected from an optical clear adhesive (OCA), a pressure sensitive adhesive (PSA), and an optical clear resin (OCR).

* * * * *